United States Patent
Kuma

(10) Patent No.: US 7,358,661 B2
(45) Date of Patent: Apr. 15, 2008

(54) ORGANIC ELECTROLUMINESCENT DEVICE AND DISPLAY

(75) Inventor: Hitoshi Kuma, Sodegaura (JP)

(73) Assignee: Idemitsu Kosan Co., Ltd., Tokyo (JP)

( * ) Notice: Subject to any disclaimer, the term of this patent is extended or adjusted under 35 U.S.C. 154(b) by 33 days.

(21) Appl. No.: 10/553,876

(22) PCT Filed: Apr. 22, 2004

(86) PCT No.: PCT/JP2004/005762

§ 371 (c)(1),
(2), (4) Date: Oct. 21, 2005

(87) PCT Pub. No.: WO2004/095892

PCT Pub. Date: Nov. 4, 2004

(65) Prior Publication Data

US 2006/0220538 A1    Oct. 5, 2006

(30) Foreign Application Priority Data

Apr. 24, 2003 (JP) ................. 2003-119305

(51) Int. Cl.
*H05B 33/00* (2006.01)
(52) U.S. Cl. ..................... 313/504; 313/506
(58) Field of Classification Search ........ 313/498–512; 428/917
See application file for complete search history.

(56) References Cited

U.S. PATENT DOCUMENTS

| | | | | |
|---|---|---|---|---|
| 5,837,391 A | * | 11/1998 | Utsugi | 428/690 |
| 5,874,803 A | * | 2/1999 | Garbuzov et al. | 313/506 |
| 6,107,734 A | * | 8/2000 | Tanaka et al. | 313/506 |
| 6,211,613 B1 | * | 4/2001 | May | 313/504 |
| 6,593,687 B1 | * | 7/2003 | Pei et al. | 313/504 |
| 6,815,886 B2 | * | 11/2004 | Kawase | 313/506 |
| 6,936,961 B2 | * | 8/2005 | Liao et al. | 313/506 |
| 2003/0020399 A1 | | 1/2003 | Moller et al. | 313/504 |
| 2003/0189401 A1 | * | 10/2003 | Kido et al. | 313/504 |

FOREIGN PATENT DOCUMENTS

| | | |
|---|---|---|
| JP | 06-176870 | 6/1994 |
| JP | 08-271704 | 10/1996 |
| JP | 11-312584 | 11/1999 |

(Continued)

OTHER PUBLICATIONS

Zeghbroeck, Bart Van. 1997. http://ece-www.colorado.edu/~bart/book/ellipstb.htm.*

(Continued)

*Primary Examiner*—Ashok Patel
(74) *Attorney, Agent, or Firm*—Steptoe & Johnson LLP

(57) ABSTRACT

An organic EL device and a display with excellent viewing-angle properties and high efficiency are provided. An organic electroluminescent device (1) comprising: a transparent electrode (12), a counter electrode (14) arranged opposite to the transparent electrode (12), one or more intermediate conductive layers (30, 32 and 34) and one or more organic emitting layers (20, 22, 24 and 26) arranged between the transparent electrode (12) and the counter electrode (14), wherein the difference between $n_a$ and $n_b$ is 0.2 or less when $n_a$ is the refractive index of the intermediate conductive layer (30) and $n_b$ is the refractive index of the organic emitting layer (20).

26 Claims, 2 Drawing Sheets

FOREIGN PATENT DOCUMENTS

| | | |
|---|---|---|
| JP | 11-312585 | 11/1999 |
| JP | 11-329748 | 11/1999 |
| JP | 2002-328201 | 11/2002 |
| JP | 2003-045676 | 2/2003 |
| WO | WO 02/17689 A1 | 2/2002 |

OTHER PUBLICATIONS

D.Z. Garbuzov et al. 1996. Chemical Physics Letters 249 (p. 433-437).*

Bader, M. et al, "Poly(*p*-phenylenevinylene) derivatives: new promising materials for nonlinear all-optical waveguide switching," J. Opt. Soc. Am. B, vol. 19, No. 9, Sep. 2002, pp. 2250-2262.

* cited by examiner

ORGANIC ELECTROLUMINESCENT DEVICE AND DISPLAY

CLAIM OF PRIORITY

This application claims priority under 35 USC 371 to International Application No. PCT/JP2004/005762, filed on Apr. 22, 2004, which claims priority to Japanese Patent Application No. 2003-119305, filed on Apr. 24, 2003, the entire contents of which are hereby incorporated by reference.

TECHNICAL FIELD

The invention relates to an organic electroluminescent device and display.

BACKGROUND ART

In order to make an organic electroluminescence (EL) device have a longer durability and higher efficiency, there is a technique of stacking a plurality of units, a unit being cathode/organic EL device/anode (for example, JP-A-H6-176870, JP-A-H11-312584 and JP-A-H11-312585).

Such a device requires a lower current density than a device having one unit to obtain the same luminance. The device with plural units thus has a longer durability. However the technique has the following problem. An electrode must be extracted from an injection electrode arranged between adjacent organic emitting layers, resulting in complicated wiring and substantial loss in electric power due to the wiring resistance.

As a technique for avoiding the problem, there is used an intermediate electrode with a hole-injection surface and the electron-injection surface opposed thereto, thereby eliminating the need of an intermediate extraction electrode (for example, JP-A-H11-329748 and JP-A-2003-45676).

However the technique has a problem that the color of emitted light observed from the font of a device is different from that observed obliquely, i.e., a high dependency on viewing angle. It also has a problem of an insufficient luminous efficiency.

In view of the above problems, an object of the invention is to provide an organic EL device and a display with good viewing-angle properties and high efficiency.

DISCLOSURE OF THE INVENTION

For the structure of an intermediate conductive layer, JP-A-H11-329748 discloses laminates of a metal thin film and transparent electrode, and JP-A-2003-45676 discloses laminates of metal, and conductive inorganic compound and/or dielectric material. The inventors have studied these structures in detail and found the following. For example, when using a conductive inorganic compound, the refractive index thereof is larger than that of an organic emitting layer, thereby degrading the viewing-angle properties. When laminating a metal film, the luminous efficiency is reduced due to the large absorption coefficient thereof.

Further in order to solve the subject of enhancing the viewing-angle properties and luminous efficiency, the inventors have found the following. A difference in refractive index between intermediate conductive layer and an organic emitting layer as small as 0.2 or less can suppress a change in chromaticity to a degree that a user cannot feel the change even when observing the emission device obliquely.

According to a first embodiment of the invention, there is provided an organic EL device comprising: a transparent electrode, a counter electrode arranged opposite to the transparent electrode, one or more intermediate conductive layers and one or more organic emitting layers arranged between the transparent electrode and the counter electrode, wherein the difference between $n_a$ and $n_b$ is 0.2 or less when $n_a$ is the refractive index of an intermediate conductive layer and $n_b$ is the refractive index of an organic emitting layer.

According to a second embodiment of the invention, there is provided an organic EL device comprising: a transparent electrode, a counter electrode arranged opposite to the transparent electrode, one or more intermediate conductive layers and a plurality of organic emitting layers sandwiching an intermediate conductive layer therebetween, the intermediate conductive layers and the organic emitting layers arranged between the transparent electrode and the counter electrode, wherein the difference between $n_a$, and $n_b$ and/or $n_c$ is 0.2 or less when $n_a$ is the refractive index of an intermediate conductive layer, $n_b$ is the refractive index of a first organic emitting layer and $n_c$ is the refractive index of a second organic emitting layer, the intermediate conductive layer sandwiched between the first and second organic emitting layers.

In these organic EL devices, the difference between $n_a$, and $n_b$ and/or $n_c$ is preferably 0.15 or less. $n_b$ and $n_c$ may be the same as each other.

The intermediate conductive layer can be a laminate of a layer which has a refractive index larger than $n_b$ and/or $n_c$, and a layer which has a refractive index smaller than $n_b$ and/or $n_c$. The laminate may be made of 2 or 3 or more layers.

Alternatively, the intermediate conductive layer can be a layer comprising a mixture of a material which has a refractive index larger than $n_b$ and/or $n_c$, and a material which has a refractive index smaller than $n_b$ and/or $n_c$.

According to a third embodiment of the invention, there is provided a display comprising the above mentioned organic EL device of the first or second embodiments.

BEST MODE FOR CARRYING OUT THE INVENTION

The invention will be described below.

Figure 1:
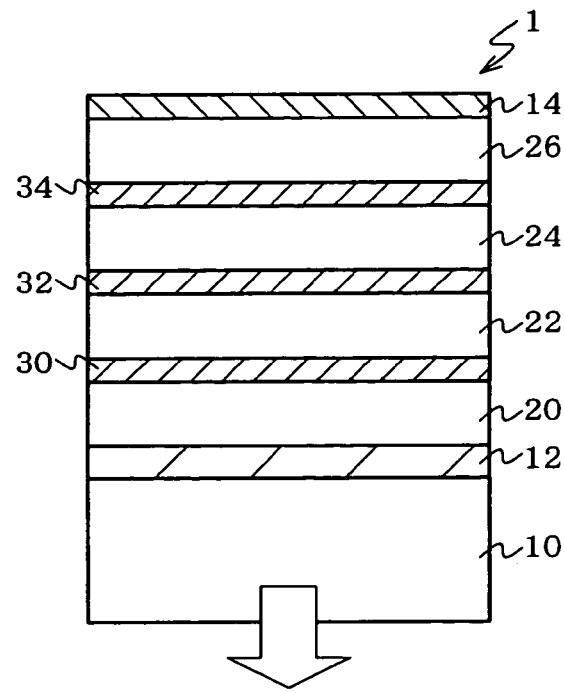
FIG. 1 is a view showing an embodiment of the organic EL device according to the invention.

FIG. 1 is a view showing an embodiment of the organic EL device according to the invention. The organic EL device is an example of stacking four organic emitting layers.

In this organic EL device 1, a transparent anode (transparent electrode) 12 is provided on a supporting substrate 10 and a cathode (counter electrode) 14 is arranged opposite to the transparent electrode 12. The organic emitting layers 20, 22, 24 and 26 and intermediate conductive layers 30, 32 and 34 are provided between the transparent anode 12 and the cathode 14 such that one intermediate conductive layer is interposed between two organic emitting layers. The light emitted from the organic emitting layers 20, 22, 24 and 26 is taken out from the supporting substrate 10 through the transparent anode 12.

Figure 2:
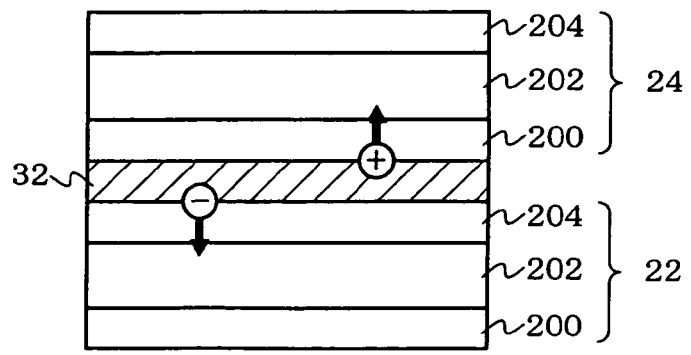
FIG. 2 is a partially enlarged view of FIG. 1.

FIG. 2 is a partially enlarged view of the organic emitting layers 22 and 24 and the intermediate conductive layer 32 therebetween as shown in FIG. 1.

The organic emitting layers 22 and 24 each are made of a hole injection layer 200, an emitting layer 202 and an electron injection layer 204. Holes supplied from the hole injection layer 200 and electrons supplied from the electron injection layer 204 are recombined with each other in the emitting layer 202 to emit light. The intermediate conductive layer 32 has the hole-injecting surface facing the organic emitting layer 24 and the electron-injecting surface facing the organic emitting layer 22.

Referring again to FIG. 1, the refractive index of any one of the intermediate conductive layers, for example, the refractive index of the intermediate conductive layer 32 is represented by $n_a$, and the organic emitting layers (first and second organic emitting layer) 22 and 24 sandwiching the intermediate conductive layer 32 are represented by $n_b$ and $n_c$, respectively. These refractive indices satisfy at least one of the following relations.

$$|n_a - n_b| < 0.2 \quad \text{(i)}$$

$$|n_a - n_c| < 0.2 \quad \text{(ii)}$$

$$|n_a - n_b| < 0.2 \text{ and } |n_a - n_c| < 0.2 \quad \text{(iii)}$$

They preferably satisfy the relation (iii).

All combinations of two organic emitting layers sandwiching an intermediate conductive layer and the intermediate conductive layer preferably satisfy at least one of the above relations.

In order to efficiently take out light from an organic emitting layer to the outside, the absorption coefficient of the intermediate conductive layer 32 is preferably 2.5 (1/μm) or less. The absorption coefficient of all the intermediate conductive layers 30, 32 and 34 is more preferably 2.5 (1/μm) or less.

Four layers of the organic emitting layers 20, 22, 24 and 26 and three layers of the intermediate conductive layers 30, 32 and 34 are the same as or different from each other.

Although four organic emitting layers are stacked in this embodiment, two, three, or five or more organic emitting layers may be stacked.

Although a transparent electrode is an anode in this embodiment, the transparent electrode may be a cathode.

Figure 3:
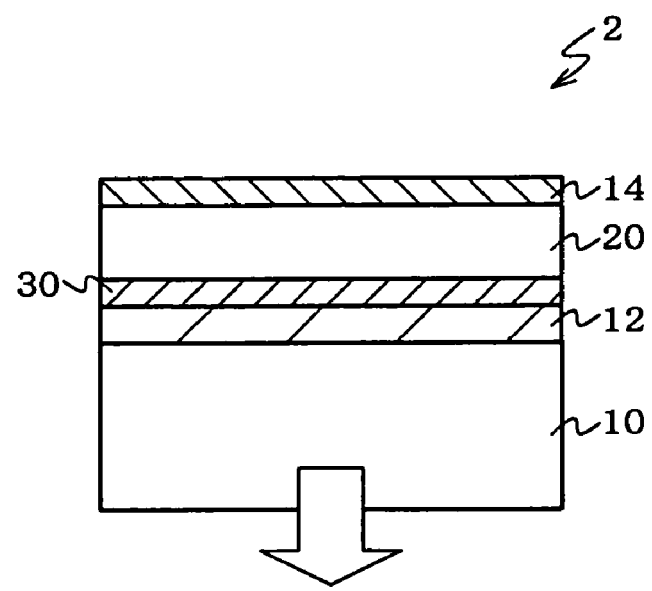
FIG. 3 is a view showing another embodiment of the organic EL device according to the invention.

FIG. 3 is a view showing another embodiment of an organic EL device according to the invention.

The organic EL device 2 is an example where only one organic emitting layer is formed. That is, the invention can be applied to a device with only one organic emitting layer.

In this organic EL device 2, a transparent anode (transparent electrode) 12 is provided on a supporting substrate 10 and a cathode (counter electrode) 14 is arranged opposite to the transparent electrode 12. One intermediate conductive layer 30 and one organic emitting layer 20 are laminated sequentially on the transparent anode 12 between the anode 12 and the cathode 14. The light emitted from the organic emitting layer 20 is taken out from the supporting substrate 10 through the transparent anode 12.

The organic emitting layer 20 and intermediate conductive layer 30 may be formed on the transparent anode 12 in this order.

In the case where an organic emitting layer or an intermediate conductive layer is a laminate, the refractive indices of the organic emitting layer and intermediate conductive layer are defined as an equivalent refractive index.

For example, in the case where an intermediate conductive layer is a laminate of a film made of a material having a high refractive index and a film made of a material having a low refractive index, the refractive index to light of wavelength λ of intermediate conductive layer is defined as follows. The thickness of the film of high-refractive-index material is represented by $d_1$, the refractive index thereof is represented by $n_1$, the thickness of the film of low-refractive-index material is represented by $d_2$, and the refractive index thereof is represented by $n_2$. Further the amounts $\delta_1$ and $\delta_2$ are defined as shown in the equations (1).

$$\delta_1 = 2\pi n_1 d_1 / \lambda$$

$$\delta_2 = 2\pi n_2 d_2 / \lambda \quad (1)$$

Further the 2×2 matrix M is defined as shown in the equation (2).

$$M = \begin{pmatrix} m_{11} & m_{12} \\ m_{21} & m_{22} \end{pmatrix} \quad (2)$$

$$= \begin{pmatrix} \cos\delta_1 & i \cdot \frac{\sin\delta_1}{n_1} \\ i \cdot n_1 \cdot \sin\delta_1 & \cos\delta_1 \end{pmatrix} \begin{pmatrix} \cos\delta_2 & i \cdot \frac{\sin\delta_2}{n_2} \\ i \cdot n_2 \cdot \sin\delta_2 & \cos\delta_2 \end{pmatrix}$$

$$\begin{pmatrix} \cos\delta_1 & i \cdot \frac{\sin\delta_1}{n_1} \\ i \cdot n_1 \cdot \sin\delta_1 & \cos\delta_1 \end{pmatrix}$$

At this time, the equivalent refractive index N of the laminated film is defined as shown in the equation (3).

$$N = \sqrt{\frac{m_{21}}{m_{12}}} \quad (3)$$

The refractive index of an organic emitting layer can be defined as an equivalent refractive index using the refractive indices of a hole injecting material, an emitting material and an electron injecting material, which constituting the organic emitting layer, in a similar way to the equations (1) to (3). Many of these materials constituting an organic emitting layer have a refractive index of about 1.7 to about 1.8. As a result, the organic emitting layer has a refractive index of about 1.7 to about 1.8.

Thus an intermediate conductive layer preferably has a refractive index of from 1.5 to 2.0.

Each member constituting an organic EL device will be described below.

1. Supporting Substrate

The supporting substrate is a member for supporting the organic EL device, TFT and the like. Therefore the substrate is preferably excellent in mechanical strength and dimension stability. Such a substrate include glass plates, metal plates, ceramic plates and plastic plates such as polycarbonate resins, acrylic resins, vinyl chloride resins, polyethylene terephthalate resins, polyimide resins, polyester resins, epoxy resins, phenol resins and silicon resins, fluorine-containing resins.

In order to avoid the invasion of moisture into the organic EL display, the substrate made of these materials is preferably subjected to a moisture proof treatment or hydrophobic treatment by forming an inorganic film or applying a fluorine-containing resin. In particular, in order to avoid the invasion of moisture into the organic luminescent medium, the substrate preferably has a small water content and gas permeability coefficient.

Specifically, preferred water content and gas permeability coefficient are 0.0001% by weight or less and $1\times10^{-13}$ cc·cm/cm$^2$·sec.cmHg or less, respectively. In order to take out light from the side of the supporting substrate, the transmittance of supporting substrate to the visible light is preferably 50% or more in this embodiment. However, when taking out light from the opposite side, that is, the cathode side, the supporting substrate is not necessarily transparent.

2. Transparent Anode

A transparent anode is preferably made of a metal, alloy electroconductive compound or mixture thereof with a large work function (i.e. 4.0 eV or more). Specifically Indium Tin Oxide (ITO), CuIn, Sn, ZnO, Au, Pt and Pd may be used solely, or in combination of two kinds or more.

Although not specially limited, the thickness of the anode is preferably from 10 nm to 1000 nm, more preferably from 10 to 200 nm. In order to take out light from an organic emitting layer to the outside, the transparent electrode is essentially transparent. More specifically, it preferably has a transmittance of 50% or more.

3. Cathode

A cathode is preferably made of a metal, alloy electroconductive compound or mixture thereof with a small work function (i.e. less than 4.0 eV). Specifically Mg, Al, In, Li, Na, Cs and Ag may be used solely, or in combination of two kinds or more.

Although not specially limited, the thickness of the cathode is preferably from 10 nm to 1000 nm, more preferably from 10 to 200 nm.

When using a cathode as a transparent electrode, transparent materials are selected among the above materials.

4. Organic Emitting Layer

The organic emitting layer can be defined as a layer containing an organic luminescent medium wherein electrons and holes are recombined with each other, thereby allowing EL emission. This organic emitting layer can be made, for example, by laminating the following layers (a) to (g) on an anode:

(a) Organic luminescent medium
(b) Hole injection layer/organic luminescent medium
(c) Organic luminescent medium/electron injection layer
(d) Hole injection layer/organic luminescent medium/electron injection layer
(e) Organic semiconductor layer/organic luminescent medium
(f) Organic semiconductor layer/electron barrier layer/organic luminescent medium
(g) Hole injection layer/organic luminescent medium/adhesion improving layer Among these (a) to (g), the structure (d) is usually preferably used since it can give a higher luminescent brightness and is also superior in durability.

Examples of luminous materials of the organic luminescent medium include only one or combinations of two or more selected from p-quaterphenyl derivatives, p-quinquephenyl derivatives, benzotiazole compounds, benzoimidazole compounds, benzoxazole compounds, metal-chelated oxynoid compounds, oxadiazole compounds, styrylbenzene compounds, distyrylpyrazine derivatives, butadiene compounds, naphthalimide compounds, perylene derivatives, aldazine derivatives, pyraziline derivatives, cyclopentadiene derivatives, pyrrolopyrrole derivatives, styrylamine derivatives, coumarin compounds, aromatic dimethylidyne-based compounds, metal complexes having an 8-quinolinol derivative as a ligand, and polyphenyl compounds.

Among these organic luminous materials, 4,4'-bis(2,2-di-t-butylphenylvinyl)biphenyl, 4,4'-bis(2,2-diphenylvinyl)biphenyl, and derivatives thereof, as aromatic dimethylidyne compounds, are more preferable.

Furthermore, it is preferred to use together a material where an organic luminous material having a distyrylarylene skeleton or the like, as a host material, is doped with a fluorescent dye giving intense from blue to red fluorescence, for example, a coumarin material, or a fluorescent dye similar to that used as a host, as a dopant. More specifically, it is preferred to use 4,4'-bis(2,2-diphenylvinyl)biphenyl or the like as a host and N,N-diphenylaminobenzene as a dopant.

Suitable known materials described in JP-A-2002-097812 and the like can also be selected for use as a luminous material.

Compounds having a hole mobility of $1\times10^{-6}$ cm$^2$/v·s or more measured at an applied voltage of $1\times10^4$ to $1\times10^6$ V/cm and an ionization energy of 5.5 eV or less are preferably used in a hole injection layer. Such a hole injection layer enables good hole injection into an organic emitting layer, thereby enhancing a high luminescent brightness or allowing low voltage drive.

Examples of a constituent material for the hole injection layer include porphyrin compounds, aromatic tertiary amine compounds, styrylamine compounds, aromatic dimethylidine compounds, condensed aromatic ring compounds and organic compounds such as 4,4-bis[N-(1-naphthyl)-N-phenylamino]biphenyl and 4,4',4"-tris[N-(3-methylphenyl)-N-phenylamino]triphenyl-amine.

Inorganic compounds such as p-type Si and P-type SiC are preferably used as a constituent material for the hole injection layer. It is also preferred that an organic semiconductive layer having an electrical conductivity of $1\times10^{-10}$ S/cm or more is formed between the above hole injection layer and an anode, or between the above hole injection layer and an organic emitting layer. Such an organic semiconductive layer enables better hole injection into an organic emitting layer.

Compounds having an electron mobility of $1\times10^{-6}$ cm$^2$/V·s or more measured at an applied voltage of $1\times10^4$ to $1\times10^6$ V/cm and an ionization energy more than 5.5 eV are preferably used in an electron injection layer.

Such an electron injection layer enables good electron injection into an organic luminescent medium, thereby enhancing a luminescent brightness or allowing low voltage drive. Examples of a constituent material for the electron injection layer include 8-hydroxyxinoline metal complexes such as Al chelate: Alq, derivatives thereof or oxadiazole derivatives.

An adhesion improving layer is a form of the electron injection layer. That is, it is a special layer comprising a material with good adhesion properties to a cathode among electron injection layers. The adhesion improving layer is preferably made of a material such as 8-hydroxyxinoline metal complexes or derivatives thereof. It is also preferred that an organic semiconductor layer with an electric conductivity of $1\times10^{-10}$ S/cm or more is formed in contact with the above electron injection layer. Such an organic semiconductor layer enables good electron injecting into an organic emitting layer.

For the thickness of the organic emitting layer, it may be preferably in the range of 5 nm to 5 μm. If the thickness is below 5 nm, the luminescent brightness and durability thereof may deteriorate, while if it is over 5 μm, the value of the voltage to be applied may become high. Therefore, the thickness of the organic luminescent medium is more preferably 10 nm to 3 μm, and still more preferably 20 nm to 1 μm.

5. Intermediate Conductive Layer

An intermediate conductive layer may be interposed between adjacent organic emitting layers as shown in FIG. 2 or may be adjacent to an organic emitting layer as shown in FIG. 3. Various layers can be used as an intermediate conductive layer that have opposing surfaces, and holes can be injected from a surface and electrons can be injected from the other surface.

Materials constituting an intermediate conductive layer include oxides, nitrides, iodides and borides of metals such as In, Sn, Zn, Ti, Zr, Hf, V, Mo, Cu, Ga, Sr, La and Ru. In addition multi-metallic compounds made of a plurality of these metals. Specifically there can be used transparent conductive materials such as ITO, IZO, $SnO_x$, $ZnO_x$, TiN, ZrN, HfN, $TiO_x$, $VO_x$, $MoO_x$, CuI, InN, GaN, $CuAlO_2$, $CuGaO_2$, $SrCu_2O_2$, $LaB_6$ and $RuO_x$. Of these, transparent conductive metal oxides such as ITO, IZO, $SnO_x$, $ZnO_x$, $TiO_x$, $VO_x$, $MoO_x$ and $RuO_x$ are preferably used.

In the invention, the difference in refractive index between an intermediate conductive layer and an organic emitting layer is 0.2 or less to improve the viewing-angle properties of a luminescence device. Thus a film containing a material having a low refractive index and the transparent conductive material stated above can be used so far as it does not impair the electron injecting property of an intermediate conductive layer.

As the material having a low refractive index, inorganic compounds such as metal oxides and metal halides, and organic compounds such as fluoride resins can be used. The metal oxides include $SiO_x$. The metal halides include metal fluorides such as NaF, LiF, $CaF_2$, $Na_3AlF_6$, $AlF_3$, $MgF_2$, $ThF_4$, $LaF_4$ and $NdF_3$.

In order to prepare an intermediate conductive layer as a film containing a material having a low refractive index and a transparent conductive material, it is preferred that these materials are mixed to form a film or otherwise a film made of a material having a low refractive index and a film made of a transparent conductive material are laminated.

For example a film can be used which is made of a mixture of a material having a low refractive index such as metal halides, e.g., metal fluorides represented by LiF and a transparent conductive material. A multi-layer laminate can also be used in which a metal fluoride and a transparent conductive material are laminated.

An intermediate conductive layer where a material having a low refractive index such as metal halides and a transparent conductive material are mixed can be produced as follows. For example two deposition sources are prepared. Materials are each mounted in the sources and co-deposited, thereby forming the film. The refractive index can be adjusted by each deposition rate of the materials. In the case where a material having a low refractive index is a metal halide such as LiF, an increased ratio is not preferred since the conductivity of an intermediate conductive layer may be degraded and the mixture may be inhomogeneous. Specifically the ratio of a metal halide in a film is preferably less than 0.6.

In the case of laminating a film of a transparent conductive material and a film of a material having a low refractive index, any laminate structure can be used that maintains the function of injecting charges, electrons and holes, required for an intermediate conductive layer. Preferred is the three-layer structure of transparent conductive material/low refractive index material/transparent conductive material. The thickness ratio of the low refractive index material film to the entire intermediate conductive layer is preferably less than 0.6.

In order to efficiently take light from an organic emitting layer to the outside, the absorption coefficient of an intermediate conductive layer relative to visible light is preferably 2.5 (1/μm) or less, more preferably 2.2 (1/μm) or less. In the case where the absorption coefficient is 2.5 (1/μm) or less, the transmittance of an intermediate conductive layer (one layer) with a film thickness of 30 nm is 92%. The transmittance is attenuated with increases in the number of layers, e.g., 86% for two layers and 80% for three layers. However some degree of high transmittance can be maintained. Generally many of transparent conductive materials have an extinction coefficient more than 0.1, while the materials represented by LiF have an extinction coefficient of almost zero. Thus the mixture or lamination of transparent conductive material and low refractive index material reduces the absorption coefficient and enhances the luminous efficiency of the device. When an intermediate conductive layer has an absorption coefficient of 2.5 (1/μm) or less, the intermediate conductive layer preferably has an extinction coefficient of 0.1 or less.

EXAMPLES

Examples of the invention will be described below. The invention is not limited thereto.

(1) Preparation of Glass Substrate with ITO

The supporting substrate of 25 mm by 75 mm (OA2 glass, Nippon Electric glass Co., Ltd.) was subjected to ultrasonic cleaning with purified water and isopropyl alcohol, dried with air blow and thereafter cleaned with ultraviolet rays. Next this substrate was moved in a sputtering apparatus. An ITO film with a film thickness of 150 nm was formed on the substrate.

(2) Formation of Organic Emitting Layer

This substrate was moved into an organic deposition device and fixed in a substrate holder. After the pressure in a vacuum vessel was reduced to $5 \times 10^{-7}$ torr, a hole injection layer, an organic luminescent medium and an electron injection layer were sequentially deposited in this order.

Firstly 4,4',4''-tris(N-(3-methylphenyl)-N-phenylamino) triphenyl-amine (MTDATA) was deposited in a thickness of 55 nm as a hole injection layer.

Next 4,4'-bis(2,2-diphenylvinyl)biphenyl (DPVBi) of a host and 1,4-bis[4-(N,N-diphenylaminostyrylbenzene)] (DPAVB) of a dopant were co-deposited in a thickness of 40 nm at a deposition speed of 0.1 to 0.3 nm/second and 0.003 to 0.008 nm/second, respectively as an organic luminescent medium.

Next tris(8-quinolinol)aluminum (Alq) was deposited in a thickness of 20 nm as an electron injection layer.

(3) Formation of Intermediate Conductive Layer

Vanadium oxide ($V_2O_5$) and lithium fluoride (LiF) were prepared as a deposition source separately. $V_2O_5$, LiF and $V_2O_5$ were sequentially deposited in a thickness of 10 nm each.

(4) Formation of Organic Emitting Layer, Intermediate Conductive Layer, Organic Emitting Layer and Cathode Next, an organic emitting layer, an intermediate conductive layer and an organic emitting layer were sequentially deposited in a similar way to the above organic emitting layer and intermediate conductive layer of (1) and (2).

Next an Al film with a thickness of 150 nm was formed as a cathode to obtain an organic EL device.

(5) Measurement of Refractive Index of Organic Emitting Layer and Intermediate Conductive Layer A hole injection layer, an organic luminescent medium and an electron injection layer were deposited on a glass substrate (OA2 glass, Nippon Electric glass Co., Ltd.) in a thickness of 0.2 micron each by the above-mentioned method of (2). Their refractive index to light with a wavelength of 500 nm was measured with an ellipsometer.

The equivalent refractive index of the organic emitting layer was determined using the film thicknesses of layers mentioned in (2) to be 1.79.

Vanadium oxide and lithium fluoride were separately formed on the glass substrate by the above-mentioned method of (3). Their refractive indices to light with a wavelength of 500 nm were measured with an ellipsometer. The equivalent refractive index of the intermediate conductive layer was determined using the film thicknesses of mentioned in (3) to be 1.95. The absorption coefficient was measured with an absorption spectrophotometer to be 2.01.

(6) Measurement of Luminescent Properties of Organic EL Device

Current was applied across the ITO and aluminum cathode at a current density of 1.4 mA/cm$^2$ to obtain blue emission. The luminance and chromaticity were measured in the front of the device with a spectral radiant luminance meter available from MINOLTA Co. Ltd. under the trademark of CS1000. The luminance was 387 nit and the chromaticity was (0.157, 0.339).

Next, the device was inclined 50° and the chromaticity was measured in the same way. The difference in chromaticity between the front direction and the viewing angle of 50° was calculated by using the equation (4) to obtain a good value of 0.025.

$$\Delta CIE = \sqrt{(CIEx_0 - CIEx_{50})^2 + (CIEy_0 - CIEy_{50})^2} \quad (4)$$

Table 1 shows the structure and evaluation results of organic EL devices prepared in Examples 1, and 2 to 5 and Comparative Examples 1 and 2 described below.

formed by co-deposition of $V_2O_5$ and LiF in a thickness of 30 nm. The deposition ratio of LiF to the entire intermediate conductive layer was 0.46. The intermediate conductive layer had a refractive index of 1.76 and absorption coefficient of 2.22. The luminance in the front direction of the organic EL device was 392 nit and the chromaticity thereof was (0.167, 0.366). The difference in chromaticity between the front direction and the viewing angle of 50° was a good value of 0.021.

Example 3

An organic EL device was prepared in the same way as Example 1 except that an intermediate conductive layer was a monolayer of $MoO_3$ film in a thickness of 30 nm. The intermediate conductive layer had a refractive index of 1.85 and absorption coefficient of 2.48. The luminance in the front direction of the organic EL device was 342 nit and the chromaticity thereof was (0.150, 0.299). The difference in chromaticity between the front direction and the viewing angle of 50° was a good value of 0.007.

Comparative Example 1

An organic EL device was prepared in the same way as Example 1 except that an intermediate conductive layer was a monolayer of $V_2O_5$ film in a thickness of 30 nm. The intermediate conductive layer had a refractive index of 2.20 and absorption coefficient of 3.02. The luminance in the front direction of the organic EL device was 320 nit and the chromaticity thereof was (0.154, 0.351). The difference in chromaticity between the front direction and the viewing angle of 50° was 0.042. The difference of chromaticity could be recognized by visual observation.

Example 4

An organic EL device was prepared in the same way as Example 3 except that an organic luminescent medium was

TABLE 1

| | Organic emitting layer | | | Intermediate conductive layer | | | Measured value | | | |
|---|---|---|---|---|---|---|---|---|---|---|
| | Type (Film thickness) | Refractive Index | Number of layers | Structure, Film thickness | Refractive Index | Absorption coefficient [l/μm] | Luminance [nit] | Front chromaticity x | Front chromaticity y | 50° ΔCIE |
| Ex. 1 | Blue emission (115 nm) | 1.79 | 3 | $V_2O_5$ (10 nm)/LiF (10 nm)/$V_2O_5$ (10 nm) | 1.95 | 2.01 | 387 | 0.157 | 0.339 | 0.025 |
| Ex. 2 | Blue emission (115 nm) | 1.79 | 3 | $V_2O_5$:LiF codeposition (30 nm) LiF/($V_2O_5$ + LiF) deposition ratio 0.46 | 1.76 | 2.22 | 392 | 0.167 | 0.366 | 0.021 |
| Ex. 3 | Blue emission (115 nm) | 1.79 | 3 | $MoO_3$ 30 nm | 1.85 | 2.48 | 342 | 0.150 | 0.299 | 0.007 |
| Com. Ex. 1 | Blue emission (115 nm) | 1.79 | 3 | $V_2O_5$ 30 nm | 2.20 | 3.02 | 320 | 0.154 | 0.351 | 0.042 |
| Ex. 4 | White emittion (115 nm) | 1.79 | 3 | $MoO_3$ 30 nm | 1.85 | 2.48 | 396 | 0.228 | 0.285 | 0.014 |
| Ex. 5 | White emittion (115 nm) | 1.79 | 1 | $MoO_3$ 30 nm | 1.85 | 2.48 | 161 | 0.273 | 0.352 | 0.018 |
| Com. Ex. 2 | White emittion (115 nm) | 1.79 | 1 | $V_2O_5$ 30 nm | 2.20 | 3.02 | 153 | 0.246 | 0.33 | 0.031 |

Example 2

An organic EL device was prepared in the same way as Example 1 except that an intermediate conductive layer was a laminate of the following orange luminescent medium and blue luminescent medium. The orange luminescent medium layer was formed on the hole injection layer at the first, and the blue luminescent medium layer was then formed.

For the orange luminescent medium film, the materials represented by the following formulas (1) and (2) were deposited at a ratio of (1) to (2) of 5 to 0.01 in a thickness of 5 nm.

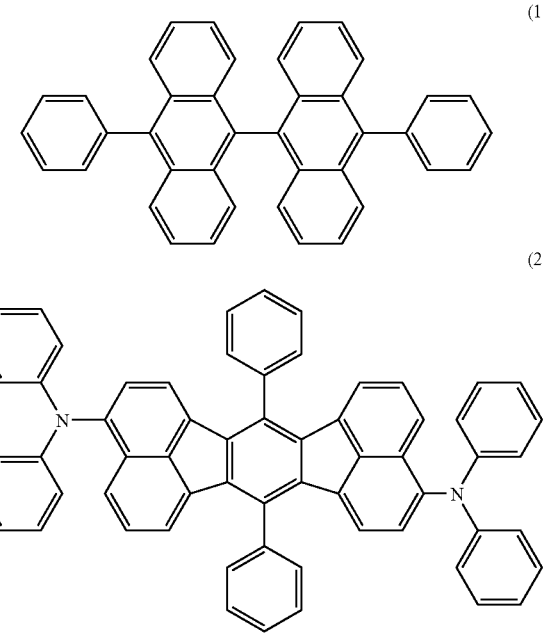

For the blue luminescent medium film, the materials represented by the above-mentioned formula (1) and the following formula (3) were deposited at a ratio of (1) to (3) of 35 to 0.8 in a thickness of 35 nm.

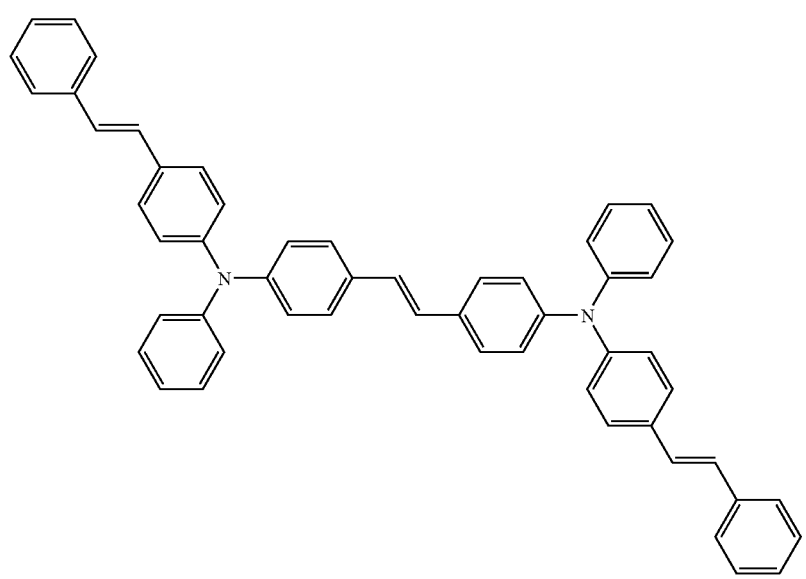

The organic emitting layer had the same refractive index of 1.79 as the other Examples. The intermediate conductive layer had a refractive index of 1.85 and absorption coefficient of 2.48. The luminance in the front direction of the organic EL device was 392 nit and the chromaticity thereof was (0.228, 0.285). The difference in chromaticity between the front direction and the viewing angle of 50° was a good value of 0.014.

Example 5

A glass substrate with a 150 nm thick ITO film prepared by the same way as Example 1 was moved into an organic deposition device. After the pressure in a vacuum vessel was reduced to $5 \times 10^{-7}$ torr, an intermediate conductive layer, an organic emitting layer and a cathode were sequentially deposited.

An intermediate conductive layer was a monolayer of $MoO_3$ film in a thickness of 30 nm.

For an organic emitting layer, MTDATA was deposited in a thickness of 55 nm as a hole injection layer, the materials represented by the above-mentioned formulas (1) and (3) were deposited at a ratio of (1) to (3) of 10 to 0.25 in a thickness of 10 nm as a blue light emitting layer, the materials represented by the above-mentioned formulas (1) and (2) were deposited at a ratio of (1) to (2) of 30 to 0.8 in a thickness of 30 nm as an orange light emitting layer, Alq was deposited in a thickness of 20 nm as an electron injection layer and Al was deposited in a thickness of 150 nm as a cathode in this order.

The organic emitting layer had a refractive index of 1.79. The intermediate conductive layer had a refractive index of 1.85 and absorption coefficient of 2.48. The luminance in the front direction of the organic EL device was 161 nit and the chromaticity thereof was (0.273, 0.352). The difference in chromaticity between the front direction and the viewing angle of 50° was a good value of 0.018.

Comparative Example 2

An organic EL device was prepared in the same way as Example 5 except that an intermediate conductive layer was a monolayer of $V_2O_5$ film in a thickness of 30 nm. The intermediate conductive layer had a refractive index of 2.20 and absorption coefficient of 3.02. The luminance in the front direction of the organic EL device was 153 nit and the chromaticity thereof was (0.246, 0.330). The difference in chromaticity between the front direction and the viewing angle of 50° was 0.031. The difference of chromaticity could be recognized by visual observation.

INDUSTRIAL UTILITY

The invention can provide an organic EL device and a display with good viewing-angle properties and high efficiency.

The organic EL device of the invention in combination with known structure can be used in a personal TV, a large-sized display, a display of cell-phone, and various displays.

The invention claimed is:

1. An organic electroluminescent device comprising:
a transparent electrode,
a counter electrode arranged opposite to the transparent electrode,
one or more intermediate conductive layers and one or more organic emitting layers arranged between the transparent electrode and the counter electrode,
wherein the difference between $n_a$ and $n_b$ is 0.2 or less when $n_a$ is the refractive index of an intermediate conductive layer and $n_b$ is the refractive index of an organic emitting layer, and the organic emitting layer comprises a hole injection layer, an organic luminescent medium and an electron injection layer.

2. The organic electroluminescent device according to claim 1, wherein the absorption coefficient (unit: 1/μm) of the intermediate conductive layer, the refractive index of which is $n_a$, is 2.5 or less.

3. A display comprising the organic electroluminescent device of claim 1.

4. An organic electroluminescent device comprising:
a transparent electrode,
a counter electrode arranged opposite to the transparent electrode,
one or more intermediate conductive layers and a plurality of organic emitting layers sandwiching an intermediate conductive layer therebetween, the intermediate conductive layers and the organic emitting layers arranged between the transparent electrode and the counter electrode,
wherein the difference between $n_a$, and $n_b$ and/or $n_c$ is 0.2 or less when $n_a$ is the refractive index of an intermediate conductive layer, $n_b$ is the refractive index of a first organic emitting layer and $n_c$ is the refractive index of a second organic emitting layer, the intermediate conductive layer sandwiched between the first and second organic emitting layers, and the organic emitting layer comprises a hole injection layer, an organic luminescent medium and an electron injection layer.

5. The organic electroluminescent device according to claim 4, wherein the absorption coefficient (unit: 1/μm) of the intermediate conductive layer, the refractive index of which is $n_a$, is 2.5 or less.

6. A display comprising the organic electroluminescent device of claim 4.

7. An organic electroluminescent device comprising:
a transparent electrode,
a counter electrode arranged opposite to the transparent electrode,
one or more intermediate conductive layers and one or more organic emitting layers arranged between the transparent electrode and the counter electrode,
wherein the difference between $n_a$ and $n_b$ is 0.2 or less when $n_a$ is the refractive index of an intermediate conductive layer and $n_b$ is the refractive index of an organic emitting layer, and the intermediate conductive layer, the refractive index of which is $n_a$, is a laminate comprising a layer having a higher refractive index than $n_b$ and a layer having a lower refractive index than $n_b$.

8. The organic electroluminescent device according to claim 7, wherein the absorption coefficient (unit: 1/μm) of the intermediate conductive layer, the refractive index of which is $n_a$, is 2.5 or less.

9. A display comprising the organic electroluminescent device of claim 7.

10. An organic electroluminescent device comprising:
a transparent electrode,
a counter electrode arranged opposite to the transparent electrode,
one or more intermediate conductive layers and a plurality of organic emitting layers sandwiching an intermediate conductive layer therebetween, the intermediate conductive layers and the organic emitting layers arranged between the transparent electrode and the counter electrode,
wherein the difference between $n_a$, and $n_b$ and/or $n_c$ is 0.2 or less when $n_a$ is the refractive index of an intermediate conductive layer, $n_b$ is the refractive index of a first organic emitting layer and $n_c$ is the refractive index of a second organic emitting layer, the intermediate conductive layer sandwiched between the first and second organic emitting layers, and the intermediate conductive layer, the refractive index of which is $n_a$, is a laminate comprising a layer having a higher refractive index than $n_b$ and/or $n_c$ and a layer having a lower refractive index than $n_b$ and/or $n_c$.

11. The organic electroluminescent device according to claim 10, wherein the absorption coefficient (unit: 1/μm) of the intermediate conductive layer, the refractive index of which is $n_a$, is 2.5 or less.

12. A display comprising the organic electroluminescent device of claim 10.

13. An organic electroluminescent device comprising:
a transparent electrode,
a counter electrode arranged opposite to the transparent electrode,
one or more intermediate conductive layers and one or more organic emitting layers arranged between the transparent electrode and the counter electrode,
wherein the difference between $n_a$ and $n_b$ is 0.2 or less when $n_a$ is the refractive index of an intermediate conductive layer and $n_b$ is the refractive index of an organic emitting layer, and the intermediate conductive layer, the refractive index of which is $n_a$, is a layer comprising a mixture of a material having a higher refractive index than $n_b$ and a material having a lower refractive index than $n_b$.

14. The organic electroluminescent device according to claim 13, wherein the absorption coefficient (unit: 1/μm) of the intermediate conductive layer, the refractive index of which is $n_a$, is 2.5 or less.

15. A display comprising the organic electroluminescent device of claim 13.

16. An organic electroluminescent device comprising:
a transparent electrode, a counter electrode arranged opposite to the transparent electrode, one or more intermediate conductive layers and a plurality of organic emitting layers sandwiching an intermediate conductive layer therebetween, the intermediate conductive layers and the organic emitting layers arranged between the transparent electrode and the counter electrode, wherein the difference between $n_a$, and $n_b$ and/or $n_c$ is 0.2 or less when $n_a$ is the refractive index of an intermediate conductive layer, $n_b$ is the refractive index of a first organic emitting layer and $n_c$ is the refractive index of a second organic emitting layer, the intermediate conductive layer sandwiched between the first and second organic emitting layers, and the intermediate conductive layer, the refractive index of which is $n_a$, is a layer comprising a mixture of a material having a higher refractive index than $n_b$ and/or $n_c$ and a material having a lower refractive index than $n_b$ and/or $n_c$.

17. The organic electroluminescent device according to claim 16, wherein the absorption coefficient (unit: 1/μm) of the intermediate conductive layer, the refractive index of which is $n_a$, is 2.5 or less.

18. A display comprising the organic electroluminescent device of claim 16.

19. An organic electroluminescent device comprising:
a transparent electrode,
a counter electrode arranged opposite to the transparent electrode,
one or more intermediate conductive layers and one or more organic emitting layers arranged between the transparent electrode and the counter electrode,
wherein the difference between $n_a$ and $n_b$ is 0.2 or less when $n_a$ is the refractive index of an intermediate conductive layer and $n_b$ is the refractive index of an organic emitting layer, and the intermediate conductive layer, the refractive index of which is $n_a$, comprises a material having a low refractive index and a transparent conductive material selected from oxides, nitrides, iodides and borides of metals.

20. The organic electroluminescent device according to claim 19, wherein the material having a low refractive index is a metal halide, and the transparent conductive material is a conductive metal oxide.

21. The organic electroluminescent device according to claim 19, wherein the absorption coefficient (unit: 1/μm) of the intermediate conductive layer, the refractive index of which is $n_a$, is 2.5 or less.

22. A display comprising the organic electroluminescent device of claim 19.

23. An organic electroluminescent device comprising:
a transparent electrode,
a counter electrode arranged opposite to the transparent electrode,
one or more intermediate conductive layers and a plurality of organic emitting layers sandwiching an intermediate conductive layer therebetween, the intermediate conductive layers and the organic emitting layers arranged between the transparent electrode and the counter electrode,
wherein the difference between $n_a$, and $n_b$ and/or $n_c$ is 0.2 or less when $n_a$ is the refractive index of an intermediate conductive layer, $n_b$ is the refractive index of a first organic emitting layer and $n_c$ is the refractive index of a second organic emitting layer, the intermediate conductive layer sandwiched between the first and second organic emitting layers, and the intermediate conductive layer, the refractive index of which is $n_a$, comprises a material having a low refractive index and a transparent conductive material selected from oxides, nitrides, iodides and borides of metals.

24. The organic electroluminescent device according to claim 23, wherein the material having a low refractive index is a metal halide, and the transparent conductive material is a conductive metal oxide.

25. The organic electroluminescent device according to claim 23, wherein the absorption coefficient (unit: 1/μm) of the intermediate conductive layer, the refractive index of which is $n_a$, is 2.5 or less.

26. A display comprising the organic electroluminescent device of claim 23.

* * * * *